(12) United States Patent
Lin

(10) Patent No.: US 8,081,405 B2
(45) Date of Patent: Dec. 20, 2011

(54) CURRENT-PERPENDICULAR-TO-PLANE (CPP) READ SENSOR WITH SMOOTHENED MULTIPLE REFERENCE LAYERS

(75) Inventor: Tsann Lin, Saratoga, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 805 days.

(21) Appl. No.: 12/129,120

(22) Filed: May 29, 2008

(65) Prior Publication Data

US 2009/0296286 A1  Dec. 3, 2009

(51) Int. Cl.
  *G11B 5/33* (2006.01)
(52) U.S. Cl. ..................................... 360/324.2
(58) Field of Classification Search .............. 360/324.11, 360/324.12, 324.2
  See application file for complete search history.

(56) References Cited

U.S. PATENT DOCUMENTS

| | | | |
|---|---|---|---|
| 7,351,483 B2 * | 4/2008 | Parkin | 428/811.1 |
| 7,602,033 B2 * | 10/2009 | Zhao et al. | 257/427 |
| 7,750,421 B2 * | 7/2010 | Horng et al. | 257/421 |
| 7,821,747 B2 * | 10/2010 | Gill | 360/324.2 |
| 7,929,259 B2 * | 4/2011 | Gao et al. | 360/324.12 |
| 2003/0072109 A1 * | 4/2003 | Sharma et al. | 360/324.2 |
| 2006/0092578 A1 | 5/2006 | Zhao et al. | |
| 2007/0047159 A1 * | 3/2007 | Zhao et al. | 360/324.12 |
| 2007/0177421 A1 | 8/2007 | Sugiyama et al. | |
| 2007/0241410 A1 | 10/2007 | Umehara et al. | |
| 2008/0299679 A1 * | 12/2008 | Zhao et al. | 438/3 |
| 2009/0161268 A1 * | 6/2009 | Lin | 360/324.11 |
| 2009/0168267 A1 * | 7/2009 | Lin | 360/324.2 |
| 2010/0128400 A1 * | 5/2010 | Lin | 360/319 |

OTHER PUBLICATIONS

Goto et al, "Fabrication and Characterization of Co-Ferrite Thin Films for Ferromagentic Barrier in a Spin-Filtering Device Operating at Room Temperature," Jun. 2007, pp. 2797-2799 (Abstract only) vol. 43, Issue 6, IEEE Transactions on Magnetics.

* cited by examiner

*Primary Examiner* — Angel A. Castro
(74) *Attorney, Agent, or Firm* — Duft Bornsen & Fishman, LLP

(57) ABSTRACT

A current-to-perpendicular-to-plane (CPP) read sensor with multiple reference layers and associated fabrication methods are disclosed. According to one embodiment, the multiple reference layers of a CPP read sensor include a first reference layer (e.g., Co—Fe) formed by a ferromagnetic polycrystalline film, a second reference layer (e.g., Co—Fe—Hf) formed by a ferromagnetic amorphous film, a third reference layer (e.g., Co—Fe—B) formed by a ferromagnetic amorphous film, and a fourth reference layer (e.g., Co—Fe) formed by a ferromagnetic polycrystalline film. A plasma treatment is applied to the fourth reference layer for surface smoothening, and no replenishment is needed as long as the fourth reference layer is not completely removed after the plasma treatment. The fourth reference layer protects the surface of the third reference layer from spin polarization deterioration caused by the plasma treatment, thereby maintaining a strong TMR or GMR effect.

21 Claims, 13 Drawing Sheets

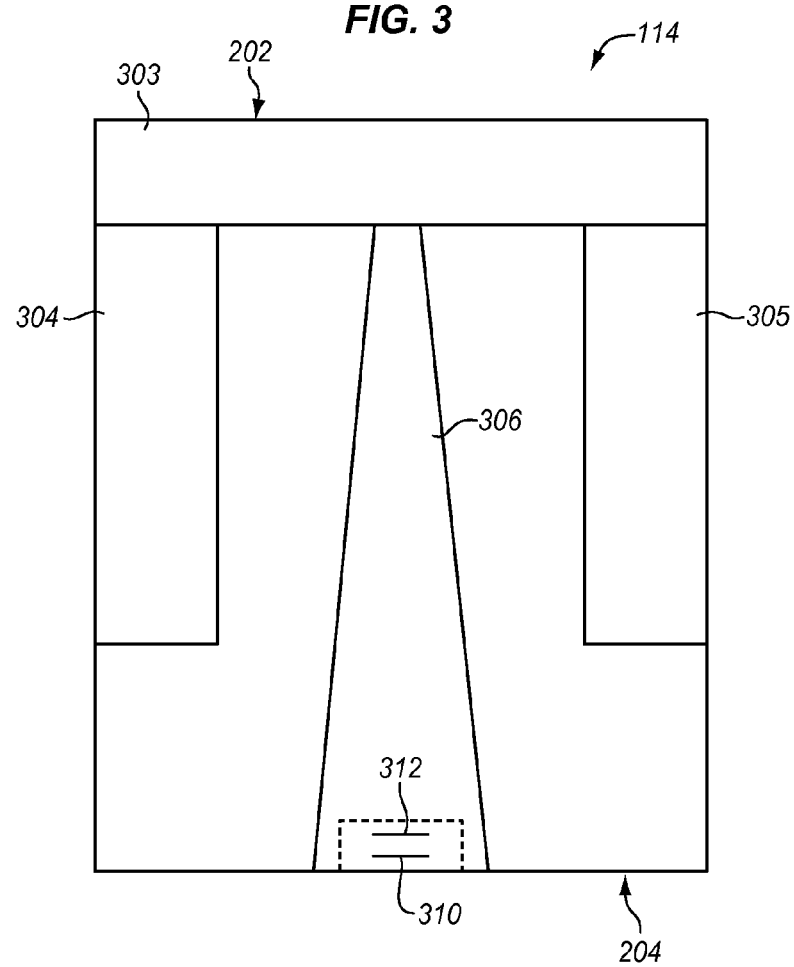
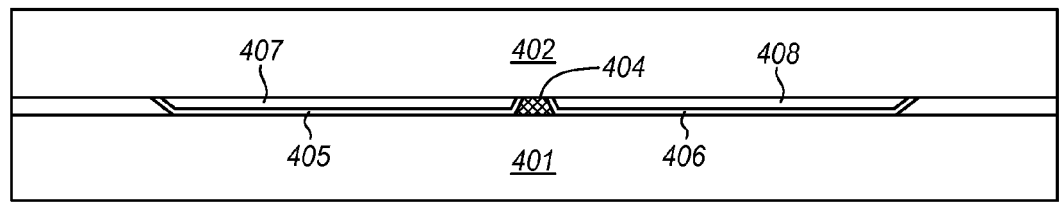

CURRENT-PERPENDICULAR-TO-PLANE (CPP) READ SENSOR WITH SMOOTHENED MULTIPLE REFERENCE LAYERS

BACKGROUND OF THE INVENTION

1. Field of the Invention

The invention is related to non-volatile magnetic storage devices, and in particular, to a hard disk drive including a current-perpendicular-to-plane (CPP) tunneling magnetoresistance (TMR) or giant magnetoresistance (GMR) read sensor with smoothened multiple reference layers.

2. Statement of the Problem

Of the many non-volatile magnetic storage devices, a hard disk drive is the most extensively used to store data. The hard disk drive includes a hard disk and an assembly of write and read heads. The assembly of write and read heads is supported by a slider that is mounted on a suspension arm. When the hard disk rotates, an actuator swings the suspension arm to place the slider over selected circular data tracks on the hard disk. The suspension arm biases the slider toward the hard disk, and an air flow generated by the rotation of the hard disk causes the slider to fly on a cushion of air at a very low elevation (fly height) over the hard disk. When the slider rides on the air, the actuator moves the suspension arm to position the write and read heads over selected data tracks on the hard disk. The write and read heads write data to and read data from, respectively, data tracks on the hard disk. Processing circuitry connected to the write and read heads then operates according to a computer program to implement writing and reading functions.

In a reading process, the read head passes over magnetic transitions of a data track on the rotating hard disk, and magnetic fields emitting from the magnetic transitions modulate the resistance of a read sensor in the read head. Changes in the resistance of the read sensor are detected by a sense current passing through the read sensor, and are then converted into voltage changes that generate read signals. The resulting read signals are used to decode data encoded in the magnetic transitions of the data track.

In a typical read head, a current-perpendicular-to-plane (CPP) tunneling magnetoresistance (TMR) or giant magnetoresistance (GMR) read sensor is electrically separated by side oxide layers from longitudinal bias layers in two side regions for preventing a sense current from shunting into the two side regions, but is electrically connected with lower and upper shields for allowing the sense current to flow in a direction perpendicular to the sensor plane. A typical CPP TMR read sensor comprises a barrier layer sandwiched between lower and upper sensor stacks. The barrier layer is formed by an electrically insulating nonmagnetic $MgO_X$ film having a thickness ranging from 0.4 to 2 nm. When the sense current quantum-jumps across the $MgO_X$ barrier layer, changes in the resistance of the CPP TMR read sensor is detected through a TMR effect. A typical CPP GMR read sensor comprises a spacer layer sandwiched between the lower and upper sensor stacks. The spacer layer is formed by an electrically conducting nonmagnetic Cu—O film having a thickness ranging from 1.6 to 4 nm. When the sense current flows across the Cu—O spacer layer, changes in the resistance of the CPP GMR read sensor is detected through a GMR effect.

In a typical TMR read sensor, the lower sensor stack comprises a first seed layer formed by a nonmagnetic Ta film, a second seed layer formed by a nonmagnetic Ru film, a pinning layer formed by an antiferromagnetic Ir—Mn film, and a flux closure structure. The flux closure structure comprises a keeper layer formed by a ferromagnetic Co—Fe film, an antiparallel coupling layer formed by a nonmagnetic Ru film, and a reference layer formed by a ferromagnetic Co—Fe—B film. The upper sensor stack comprises a sense layer formed by a ferromagnetic Co—Fe—B film and a cap layer formed by a nonmagnetic Ru film. Both the Co—Fe—B reference and sense layers exhibit a "soft" amorphous phase after deposition, which will be transformed into a polycrystalline phase after annealing. With this crystallization, a Co—Fe—B(001)[110]//$MgO_X$(001)[100]//Co—Fe—B(001)[110] epitaxial relationship is developed, and thus the TMR effect is substantially enhanced.

In the typical TMR read sensor, four fields are induced and used for proper sensor operation. First, a unidirectional anisotropy field (HUA) is induced by unidirectional antiferromagnetic/ferromagnetic coupling between the pinning and keeper layers. Second, an antiparallel-coupling field (HAPC) is induced by antiparallel ferromagnetic/ferromagnetic coupling across the antiparallel-coupling layer and between the keeper and reference layers. Third, a demagnetizing field (HD) is induced by the net magnetization of the keeper and reference layers. Fourth, a ferromagnetic-coupling field (HF) is induced by ferromagnetic/ferromagnetic coupling across the barrier layer and between the reference and sense layers. To ensure proper sensor operation, HUA and HAPC must be high enough to rigidly pin magnetizations of the keeper and reference layers in opposite transverse directions perpendicular to an air bearing surface (ABS), while HD and HF must be small and balance with each other to orient the magnetization of the sense layer in a longitudinal direction parallel to the ABS.

In order for the TMR read sensor to exhibit a high TMR coefficient ($\Delta R_T/R_J$) while maintaining a low $H_F$ and a low junction resistance-area product ($R_J A_J$), the lower sensor stack is smoothened for growing a flat barrier layer. Presently, a plasma treatment is applied to the reference layer to smoothen its surface, and then a ferromagnetic film is deposited to replenish the smoothened reference layer. This smoothening technique creates a smooth foundation for the barrier layer to grow with a flat topography, and thus for the TMR read sensor to attain a low $H_F$. However, this smoothening technique inevitably causes argon gas bombardments at a "stitched" interface in the replenished reference layer. These bombardments create contact resistance and deteriorate spin polarization, thus increasing $R_J A_J$ and decreasing $\Delta R_T/R_J$, respectively.

SUMMARY

Embodiments of the invention provide a current-perpendicular-to-plane (CPP) tunneling magnetoresistance (TMR) or giant magnetoresistance (GMR) read sensor with smoothened multiple reference layers. In contrast to having a barrier or spacer layer sandwiched between Co—Fe—B reference and sense layers in a prior art read sensor, the barrier or spacer layer is sandwiched between Co—Fe reference and sense layers in the embodiments described herein. The Co—Fe reference and sense layers prevent the Co—Fe—B reference and sense layers, respectively, from B diffusion and segregation at interfaces of the barrier or spacer layer during annealing.

In one embodiment of the invention, a CPP read sensor comprises a first reference layer formed by a ferromagnetic polycrystalline film (e.g., Co—Fe), a second reference layer formed by a ferromagnetic "hard" amorphous film (e.g., Co—Fe—X where X is Hf, Zr or Y), a third reference layer formed by a ferromagnetic "soft" amorphous film (e.g., Co—Fe—B), and a fourth reference layer formed by a ferromagnetic polycrystalline film (e.g., Co—Fe) which is smoothened by a plasma treatment.

The first reference layer strongly antiparallel-couples to a keeper layer across an antiparallel-coupling layer, thereby producing a high antiparallel-coupling field. The second reference layer provides a thermally stable flat amorphous surface, thereby facilitating the third reference layer to freely grow its own amorphous phase during deposition and freely develop a polycrystalline phase during annealing. The third reference layer provides strong spin polarization through an epitaxial relationship with a barrier or spacer layer after the transformation from the amorphous to crystalline phases, thereby exhibiting a strong TMR or GMR effect. The fourth reference layer protects the surface of the third reference layer from damages caused by the plasma treatment, thereby maintaining the strong TMR or GMR effect.

The invention may include other exemplary embodiments as described below.

DESCRIPTION OF THE DRAWINGS

The same reference number represents the same element or same type of element on all drawings.

FIG. 3 is a schematic diagram illustrating an ABS view of a slider.

FIG. 4 is a schematic diagram illustrating an ABS view of a read head fabricated on a slider.

DETAILED DESCRIPTION OF THE INVENTION

FIGS. 1-16 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
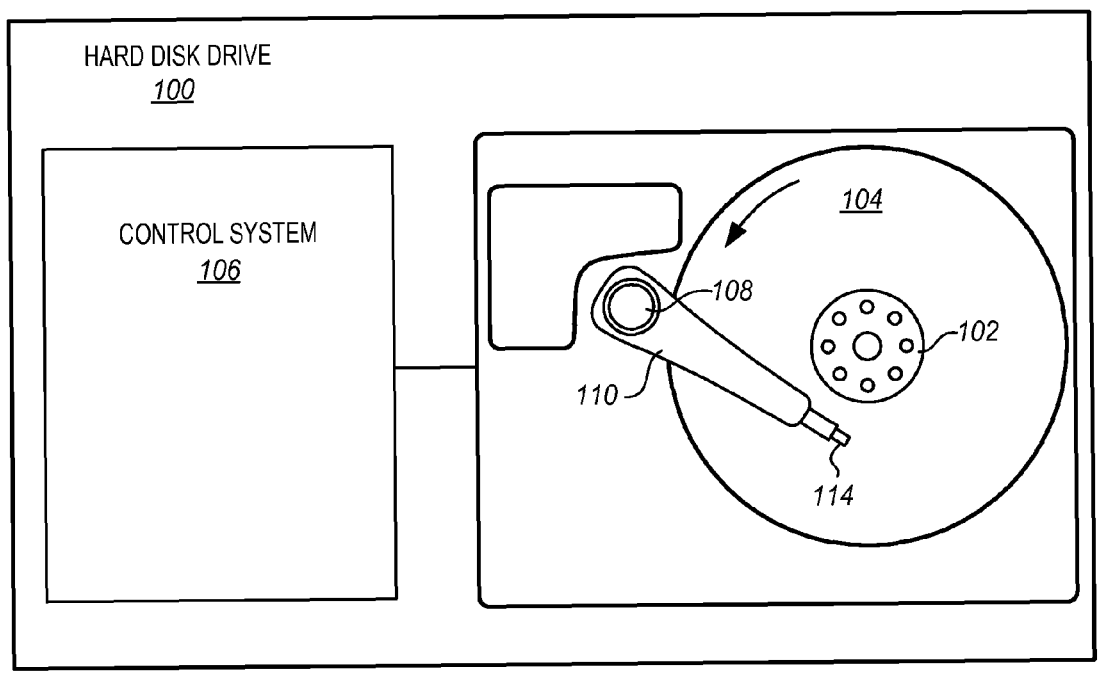
FIG. 1 is a schematic diagram illustrating a hard disk drive used as a non-volatile magnetic storage device.

FIG. 1 illustrates a hard disk drive 100 used as a non-volatile magnetic storage device. The hard disk drive 100 includes a spindle 102, a hard disk 104, a control system 106, an actuator 108, a suspension arm 110, and a slider 114 supporting an assembly of write and read heads. The spindle 102 supports and rotates the hard disk 104 in a direction indicated by the arrow. A spindle motor (not shown) rotates the spindle 102 according to control signals from the control system 106. The slider 114 is mounted on the suspension arm 110, and the actuator 108 is configured to rotate the suspension arm 110 in order to position the assembly of write and read heads over a desired data track on the hard disk 104. The hard disk drive 100 may include other components not shown in FIG. 1, such as a plurality of hard disks, actuators, suspension arms, and sliders.

When the hard disk 104 rotates, an air flow generated by the rotation of the hard disk 104 causes the slider 114 to fly on a cushion of air at a very low elevation (fly height) over the rotating hard disk 104. As the slider 114 flies on the air, the actuator 108 moves the suspension arm 110 to position a write head (not shown) and a read head (not shown) over selected data tracks on the hard disk 104. The write and read heads write data to and read data from, respectively, data tracks on the hard disk 104. Processing circuitry connected to the write and read heads then operates according to a computer program to implement writing and reading functions.

Figure 2:
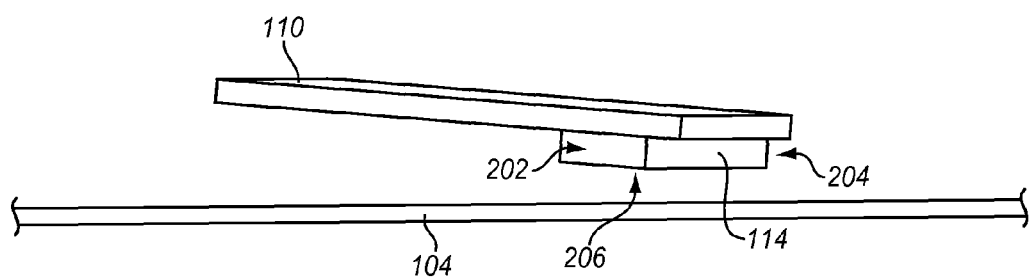
FIG. 2 is a schematic diagram illustrating a side view of a hard disk drive.

FIG. 2 is a side view of the hard disk drive 100. The slider 114 flies on the air over the rotating hard disk 104. The slider 114 includes a front end 202 and an opposing trailing end 204. The slider 114 also includes an air bearing surface (ABS) 206 that faces toward the surface of the hard disk 104. A write head (not shown) and a read head (not shown) are formed proximate to the trailing end 204, which is further illustrated in FIG. 3.

FIG. 3 is an ABS view of the slider 114. The ABS 206 of the slider 114 is the surface of the page in FIG. 3. The slider 114 has a cross rail 303, two side rails 304-305, and a center rail 306 on the ABS 206. The rails, which define how the slider 114 flies over the rotating hard disk 104, illustrate just one embodiment, and the configuration of the ABS 206 of the slider 114 may take on any desired form. The slider 114 includes a write head 310 and a read head 312 fabricated proximate to the trailing end 204.

FIG. 4 illustrates an ABS view of the read head 212 fabricated on the slider 114. The read head 212 includes a lower shield 401 and an upper shield 402 that sandwich a TMR read sensor 404 and two side regions at edges of the TMR read sensor 404. In the two side regions, side oxide layers 405-406 separate longitudinal bias layers 407-408, respectively, from the lower shield 401 and the TMR read sensor 404.

Figure 5:
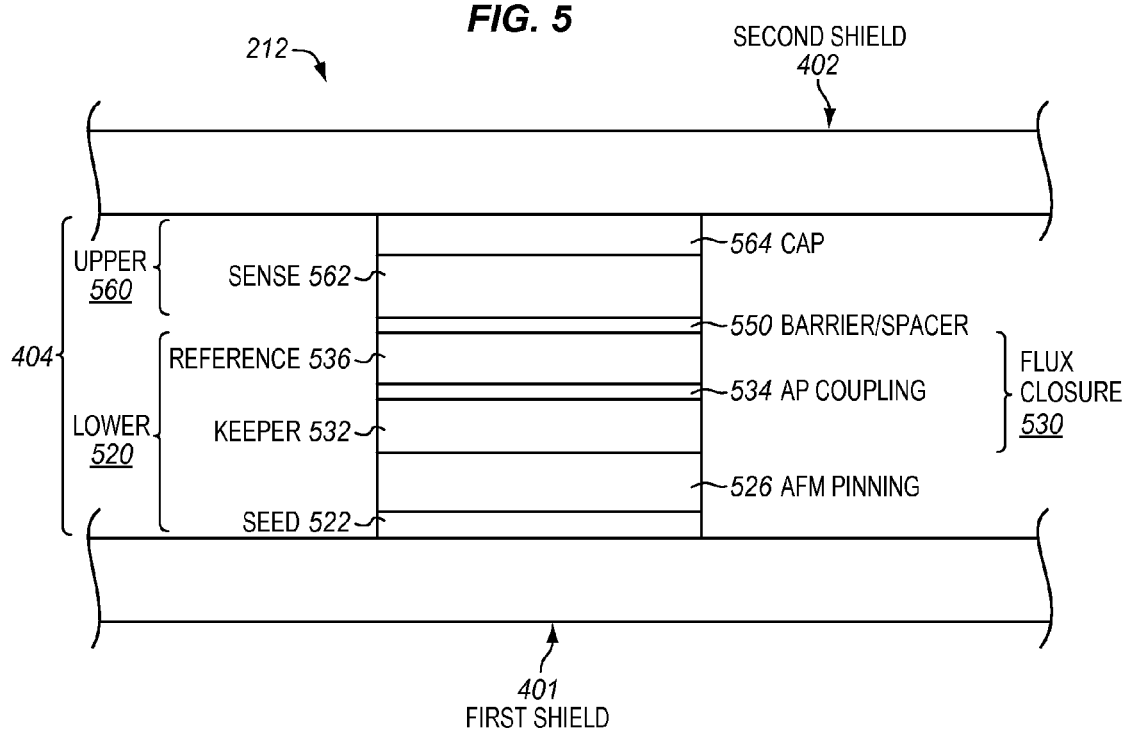
FIG. 5 is a schematic diagram illustrating an ABS view of a TMR read sensor in a read head in an exemplary embodiment of the invention.

FIG. 5 illustrates an ABS view of a TMR read sensor 404 of the TMR read head 212 in an exemplary embodiment of the invention. The TMR read sensor 404 includes a barrier layer 550 sandwiched between a lower sensor stack 520 and an upper sensor stack 560. The lower sensor stack 520 comprises multiple seed layers 522 formed by nonmagnetic films, a pinning layer 526 formed by an antiferromagnetic film, and a flux closure structure 530. The flux closure structure 530 comprises a keeper layer 532 formed by a ferromagnetic film, an antiparallel coupling layer 534 formed by a nonmagnetic film, and multiple reference layers 536. The upper sensor stack 560 comprises multiple sense layers 562 formed by ferromagnetic films and a cap layer 564 formed by a nonmagnetic film.

Figure 6:
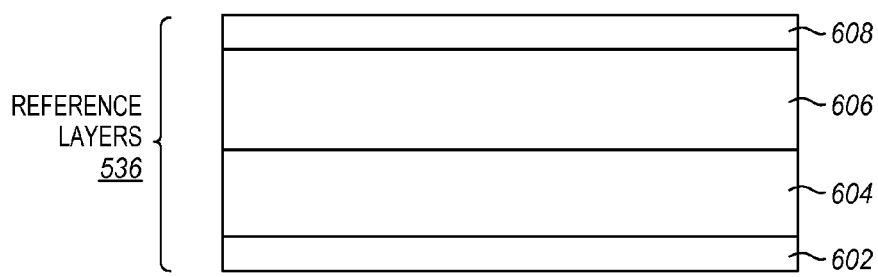
FIG. 6 is a schematic diagram illustrating smoothened multiple reference layers in an exemplary embodiment of the invention.

FIG. 6 illustrates smoothened multiple reference layers 536 in an exemplary embodiment of the invention. The smoothened multiple reference layers 536 comprise a first reference layer 602 formed by a polycrystalline ferromagnetic film (e.g., a 77.5Co-22.5Fe film (in atomic percent)), a second reference layer 604 formed by a "hard" amorphous ferromagnetic film (e.g., a 66.2Co-9.6Fe-24.2Hf film), a third reference layer 606 formed by a "soft" amorphous ferromagnetic film (e.g., a 51.9Co-34.6Fe-13.5B film), and a fourth reference layer 608 formed by a polycrystalline ferromagnetic film (e.g., a 77.5Co-22.5Fe film) after a plasma treatment. The first reference layer 602 may include Co with a content ranging from 50 to 90 at %, Fe with a content ranging from 10 to 50 at %, and have a thickness ranging from 0.2 to 1 nm. The second reference layer 604 may include Co with a content ranging from 60 to 80 at %, Fe with a content ranging from 0 to 40 at %, Hf with a content ranging from 6 to 30 at %, and have a thickness ranging from 0.6 to 3 nm. Other chemical elements such as Zr or Y may replace Hf to also form the "solid" amorphous phase. The third reference layer 606 may include Co with a content ranging from 60 to 80 at %, Fe with a content ranging from 0 to 40 at %, B with a content ranging from 6 to 30 at %, and have a thickness ranging from 1 to 2 nm. The fourth reference layer 608 may contain Co with a content ranging from 50 to 90 at %, Fe with a content ranging from 10 to 50 at %, and have a thickness ranging from 0.2 to 1 nm after the plasma treatment.

Although FIG. 6 illustrates the smoothened multiple reference layers 536 for the TMR read sensor 212, those skilled in the art will appreciate that that the concept of the smoothened multiple reference layers as described in FIG. 6 may also apply to the CPP GMR read sensor, where a spacer layer replaces the barrier layer 550 between the lower and upper sensor stacks.

Figure 7:
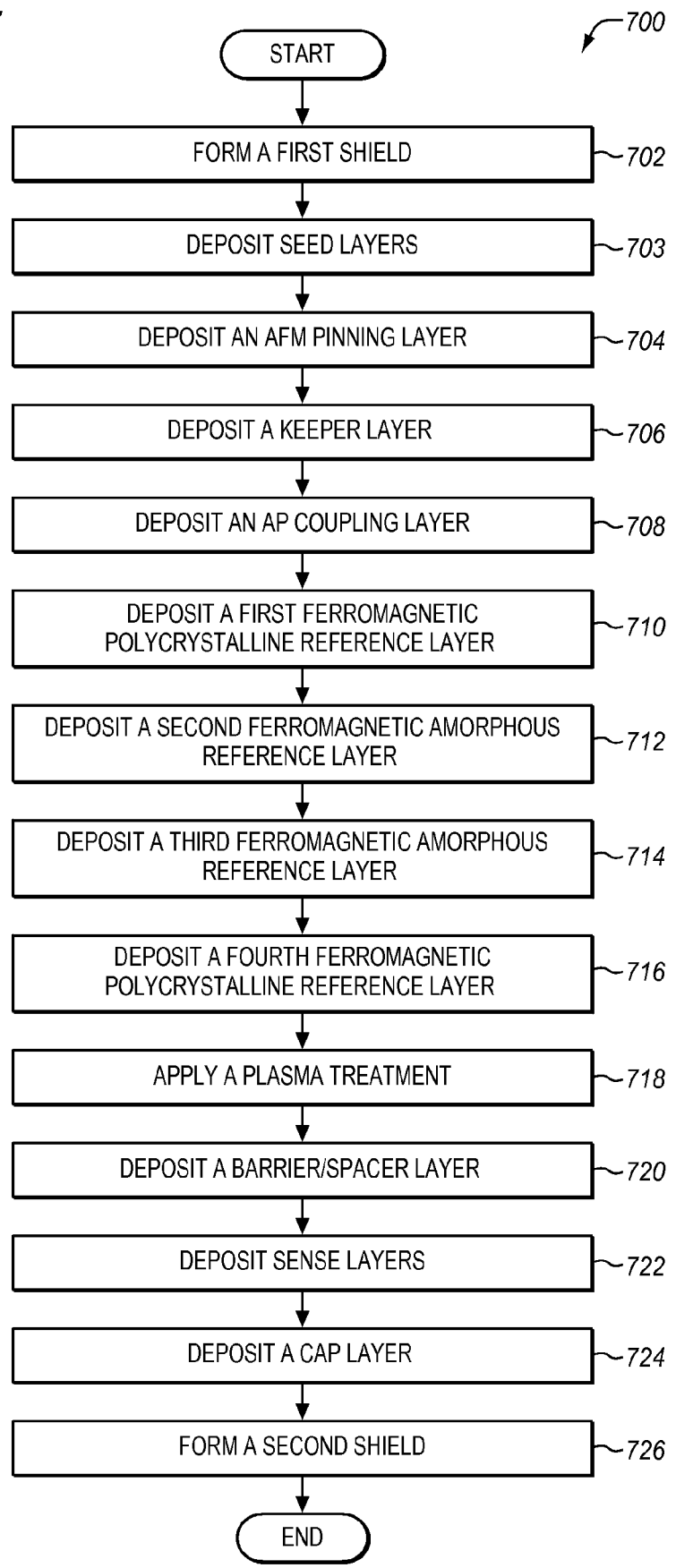
FIG. 7 is a flow chart illustrating a method of fabricating a TMR read sensor in an exemplary embodiment of the invention.

FIG. 7 shows a flow chart illustrating a method 700 of fabricating a TMR read sensor with smoothened multiple reference layers in an exemplary embodiment of the invention. The steps of the flow chart in FIG. 7 are not all inclusive and may include other steps not shown. Step 702 comprises forming the lower shield 401 on a wafer (see also FIG. 5). After the lower shield 401 is formed, chemical mechanical polishing (CMP) is performed in order for the lower shield 401 to provide a smooth surface for the TMR read sensor 404 to grow. Step 703 comprises depositing the multiple seed layers 522 on the lower shield 401. Step 704 comprises depositing the pinning layer 526 on the multiple seed layers 522. A flux closure structure 530 is then formed on the pinning layer 526 as described in steps 706-716.

For the flux closure structure 530, step 706 comprises depositing the keeper layer 532 on the pinning layer 526. Step 708 comprises depositing the antiparallel coupling layer 534 on the keeper layer 532. Step 710 comprises depositing the first reference layer 602 on the antiparallel coupling layer 534 (see also FIG. 6). Step 712 comprises depositing the second reference layer 604 on the first reference layer 602. Step 714 comprises depositing the third reference layer 606 on the second reference layer 604. Step 716 comprises depositing the fourth reference layer 608 on the third reference layer 606. Step 718 comprises applying a plasma treatment to the fourth reference layer 608. For the reference layers deposited in steps 710-716, the following compositions may be used. The first reference layer 602 may be formed by a ferromagnetic polycrystalline Co—Fe film having a thickness ranging from 0.2 to 1.2 nm. The second reference layer 604 may be formed by a ferromagnetic "hard" amorphous Co—Fe—X film having a thickness ranging from 0.6 to 3 nm, where X is Hf, Zr or Y. The third reference layer 606 may be formed by a ferromagnetic "soft" amorphous Co—Fe—B film having a thickness ranging from 1 to 2 nm. The fourth reference layer 608 may be formed by another ferromagnetic polycrystalline Co—Fe film having a thickness ranging from 0.2 to 1.2 nm after the plasma treatment of step 718.

Step 720 comprises depositing the barrier layer 550 on the plasma-treated fourth reference layer 608. Step 722 comprises depositing the multiple sense layers 562 on the barrier layer 550. Step 724 comprises depositing the cap layer 564 on the multiple sense layers 562. After depositing multiple protection layers on the cap layer 564, the TMR read sensor is annealed in a magnetic field in a vacuum oven, and is then patterned into round devices. Side oxides and longitudinal bias layers are deposited into two side regions. CMP is performed to planarize the TMR read sensor. After removing the multiple protection layers, step 726 is performed to form the upper shield 402 on the cap layer 564.

Figure 8:
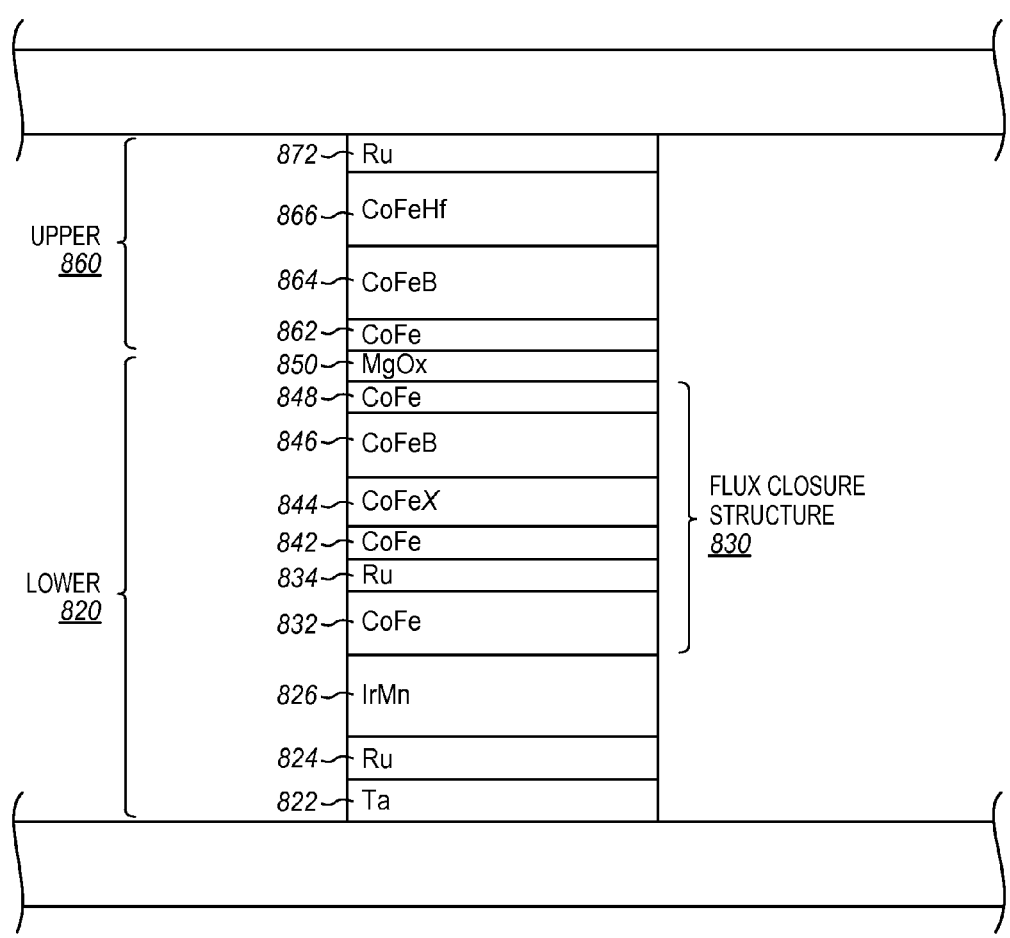
FIG. 8 is a schematic diagram illustrating an ABS view of a TMR read sensor in an exemplary embodiment of the invention.

FIG. 8 illustrates an ABS view of a TMR read sensor 800 fabricated according to the method 700 in an exemplary embodiment of the invention. The TMR read sensor 800 includes a barrier layer 850 sandwiched between a lower sensor stack 820 and an upper sensor stack 860. The barrier layer 850 may be formed by a magnesium oxide (MgO) film sandwiched between two nonmagnetic oxygen-doped Mg (Mg—O) films, as described below. A 0.2 nm thick Mg film is DC sputtered in an argon gas of $3 \times 10^{-4}$ torr from an Mg target with a power of 40 W. A first oxygen treatment in an oxygen gas of $5 \times 10^{-7}$ torr is then applied to the Mg film, resulting in oxygen doping into the Mg film. A 0.4 nm thick MgO film is then RF sputtered in an argon gas of $4.5 \times 10^{-4}$ torr from an MgO target with a power of 200 W. Another 0.2 nm thick Mg film is then DC sputtered in an argon gas of $3 \times 10^{-4}$ torr from the Mg target with a power of 40 W. A second oxygen treatment in an oxygen gas of $5 \times 10^{-5}$ torr is then applied to the Mg film. With the first mild oxygen treatment and the second heavy oxygen treatment, the Mg—O, MgO, and Mg—O films are integrated into an $MgO_X$ film which forms the barrier layer 850.

The lower sensor stack 820 comprises a first seed layer 822 formed by a 3 nm thick nonmagnetic Ta film, a second seed layer 824 formed by a 2 nm thick nonmagnetic Ru film, a pinning layer 826 formed by a 6 nm thick antiferromagnetic 21.7Ir-78.3Mn film (composition in atomic percent), and a flux closure structure 830. The flux closure structure 830 comprises a keeper layer 832 formed by a 2.2 nm thick ferromagnetic 77.5Co-22.5Fe film, an antiparallel coupling layer 834 formed by a 0.8 nm thick nonmagnetic Ru film, and plasma-treated multiple reference layers. The plasma-treated multiple reference layers comprises a first reference layer 842 formed by a 0.4 nm thick ferromagnetic polycrystalline 77.5Co-22.5Fe film, a second reference layer 844 formed by a 1.2 nm thick ferromagnetic "hard" amorphous 66.2Co-9.7Fe-24.1Hf film, a third reference layer 846 formed by a 1.2 nm thick ferromagnetic "soft" amorphous 51.9Co-34.6Fe-13.5B film, and a fourth reference layer 848 formed by a 0.3 nm thick ferromagnetic polycrystalline 77.5Co-22.5Fe film after the plasma treatment.

The upper sensor stack 860 comprises a first sense layer 862 formed by a 0.4 nm thick ferromagnetic 87.1Co-12.9Fe film, a second sense layer 864 formed by a 1.6 nm thick ferromagnetic 71.5Co-7.4Fe-21.1B film, a third sense layer 866 formed by a 1.4 nm thick ferromagnetic 74.0Co-10.8Fe-15.2Hf film, and a cap layer 872 formed by a 6 nm thick nonmagnetic Ru film.

In this embodiment of the invention, the TMR read sensor 800 is deposited on bare glass substrates and wafers with lower shields formed by 1 μm thick ferromagnetic Ni—Fe films in a sputtering system, and is annealed in a magnetic field of 50,000 Oe for 5 hours at 240° C. in a high-vacuum oven. The TMR read sensor 800 that is deposited on the bare glass substrate is measured with a vibrating sample magnetometer to determine $H_F$. The TMR read sensor 800 that is deposited on the wafer is coated with upper conducting leads formed by 75 nm thick Cu and 12 nm thick Ru films, and is probed with a 12-point microprobe in a magnetic field of about 160 Oe. Resistance data taken from probing with any four of the 12-point microprobe are analyzed with a current-in-plane tunneling model to determine $R_J A_J$ and $\Delta R_T/R_J$.

Figure 9:
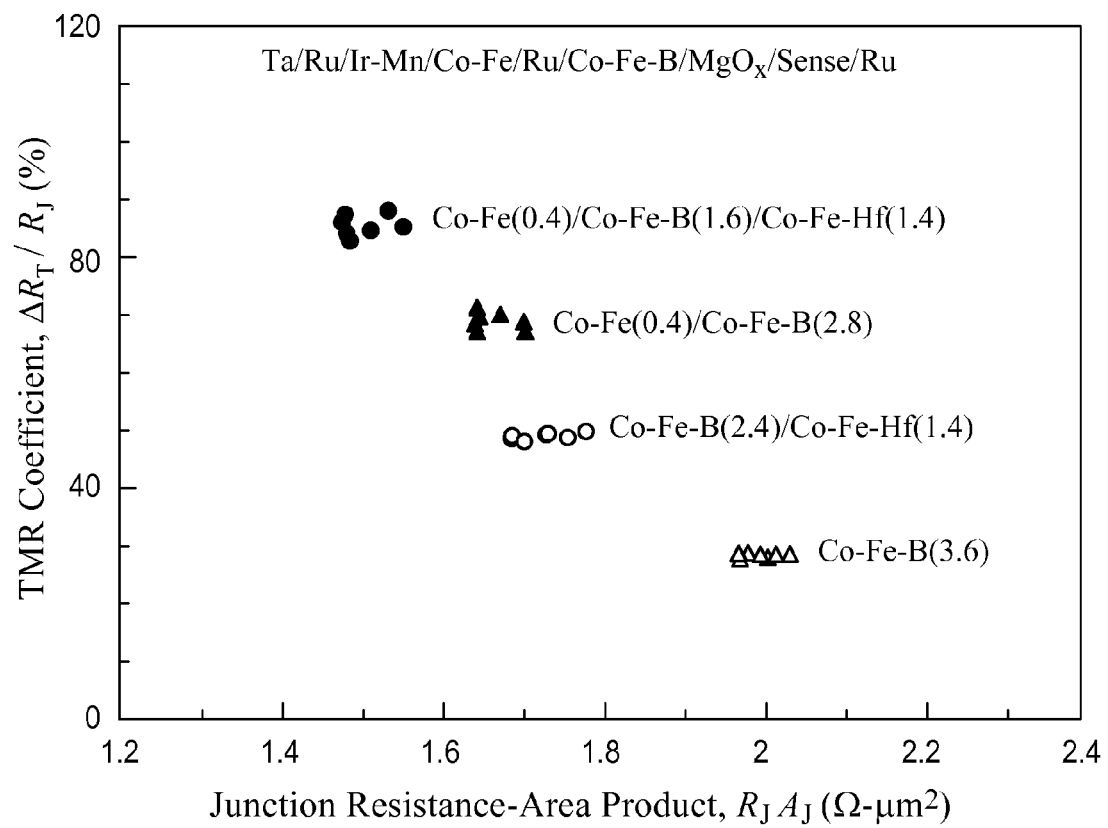
FIG. 9 is a chart showing $\Delta R_T/R_J$ versus $R_JA_J$ for TMR read sensors comprising Ta(3)/Ru(2)/Co—Fe(2.2)/Ru(0.8)/Co—Fe—B(2.4)/MgO$_X$(0.8)/sense/Ru(6) layers (thickness in nm), where the sense layers are formed by Co—Fe—B (3.6), Co—Fe(0.4)/Co—Fe—B(2.8), Co—Fe—B(2.4)/Co—Fe—Hf(1.4), and Co—Fe(0.4)/Co—Fe—B(1.6)/Co—Fe—Hf(1.4) films.

FIG. 9 shows $\Delta R_T/R_J$ versus $R_J A_J$ for TMR read sensors comprising Ta(3)/Ru(2)/Co—Fe(2.2)/Ru(0.8)/Co—Fe—B(2.4)/$MgO_X$(0.8)/sense/Ru(6) layers (thickness in nm), where the sense layers are formed by Co—Fe—B(3.6), Co—Fe(0.4)/Co—Fe—B(2.8), Co—Fe—B(2.4)/Co—Fe—Hf(1.4), and Co—Fe(0.4)/Co—Fe—B(1.6)/Co—Fe—Hf (1.4) films. Thicknesses of the Co—Fe keeper and Co—Fe—B reference layers are fixed in order to attain designed magnetic moments of 0.28 and 0.30 memu/cm² (equivalent to those of 4 and 4.3 nm thick 80Ni-20Fe films sandwiched between two Cu films, respectively) for ensuring proper sensor operation. Thicknesses of the sense layers are adjusted in order to attain a designed magnetic moment of 0.32 memu/cm² (equivalent to that of a 4.5 nm thick 80Ni-20Fe film sandwiched between two Cu films) for achieving high read sensitivity.

It is unexpectedly found that contacts of various sense layers with an identical $MgO_X$ barrier layer lead to substantial $R_J A_J$ and $\Delta R_T/R_J$ variations, as described below. The insertion of the Co—Fe sense layer between the $MgO_X$ barrier and Co—Fe—B sense layers causes an $R_J A_J$ decrease from 2.0 to 1.7 Ω-μm² and a $\Delta R_T/R_J$ increases from 28.8 to 69.3%. The Co—Fe sense layer thus also acts as a diffusion barrier layer in suppressing B diffusion and eliminating B segregation at the upper interface of the $MgO_X$ barrier layer during annealing, thereby decreasing $R_J A_J$ while increasing $\Delta R_T/R_J$. The insertion of the Co—Fe—Hf sense layer between the Co—Fe—B sense and Ru cap layers also causes an $R_J A_J$ decrease from 2.0 to 1.7 Ω-μm² and a $\Delta R_T/R_J$ increase from 28.8 to 49.3%. The Co—Fe—Hf sense layer thus also acts as a diffusion barrier layer in suppressing B diffusion into the Ru cap layer, thereby decreasing $R_J A_J$ while increasing $\Delta R_T/R_J$. In addition, the insertion of both the Co—Fe and Co—Fe—Hf sense layers leads to an $R_J A_J$ of as low as 1.5 Ω-m² and a $\Delta R_T/R_J$ of as high as 85.8%.

Figure 10:
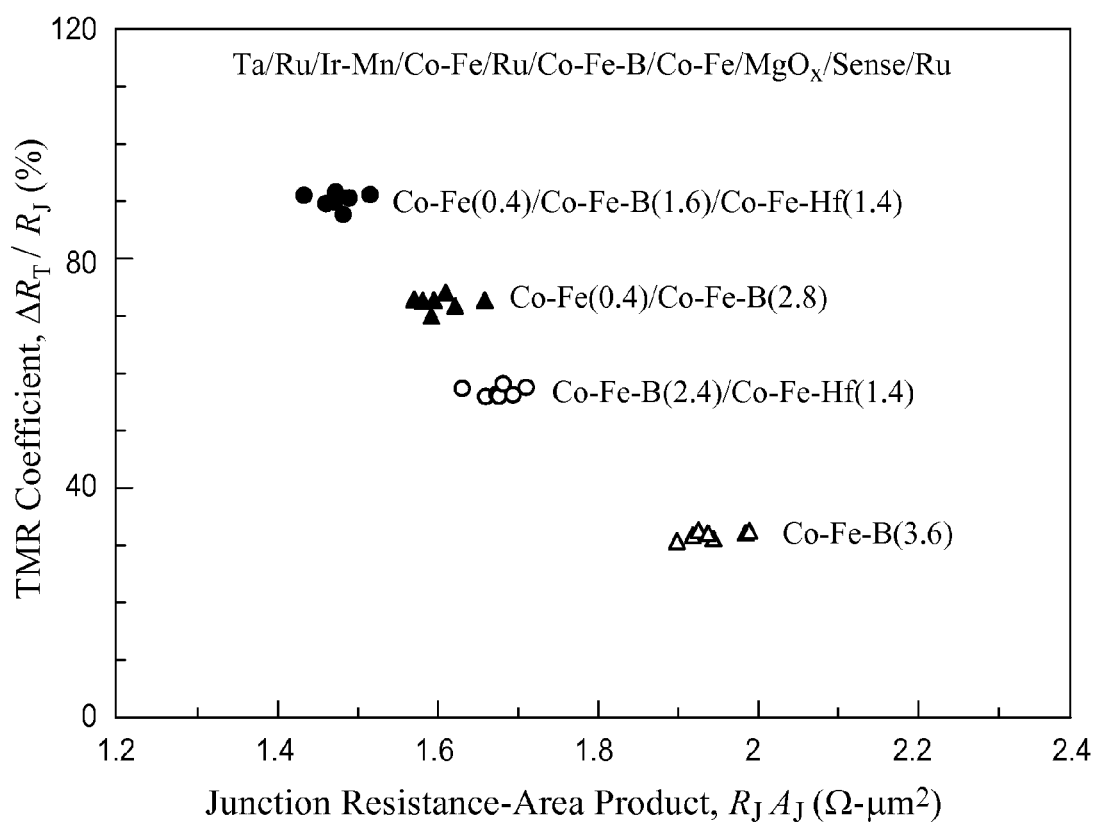
FIG. 10 is a chart showing $\Delta R_T/R_J$ versus $R_JA_J$ for TMR read sensors comprising Ta(3)/Ru(2)/Co—Fe(2.2)/Ru(0.8)/Co—Fe—B(2.0)/Co—Fe(0.3)/MgO$_X$(0.8)/sense/Ru(6) layers, where the sense layers are formed by Co—Fe—B(3.6), Co—Fe(0.4)/Co—Fe—B(2.8), Co—Fe—B(2.4)/Co—Fe—Hf(1.4), and Co—Fe(0.4)/Co—Fe—B(1.6)/Co—Fe—Hf (1.4) films.

FIG. 10 shows $\Delta R_T/R_J$ versus $R_J A_J$ for TMR read sensors comprising Ta(3)/Ru(2)/Co—Fe(2.2)/Ru(0.8)/Co—Fe—B(2.0)/Co—Fe(0.3)/$MgO_X$(0.8)/sense/Ru(6) layers, where the sense layers are formed by Co—Fe—B(3.6), Co—Fe(0.4)/Co—Fe—B(2.8), Co—Fe—B(2.4)/Co—Fe—Hf(1.4), and Co—Fe(0.4)/Co—Fe—B(1.6)/Co—Fe—Hf(1.4) films. The Co—Fe reference layer is sandwiched between the Co—Fe—B reference and $MgO_X$ barrier layers. Thicknesses of the Co—Fe—B first and Co—Fe second reference layers are adjusted in order to attain the designed magnetic moment of 0.30 memu/cm.

It is confirmed that contacts of various sense layers with an identical $MgO_X$ barrier layer lead to substantial $R_J A_J$ and $\Delta R_T/R_J$ variations. For example, the independent uses of the Co—Fe and Co—Fe—Hf films as additional sense layers cause $R_J A_J$ decreases from 2.0 to 1.6 and 1.7 Ω-μm², respectively, and $\Delta R_T/R_J$ increases from 32.1 to 72.5 and 56.8%, respectively. In addition, the combined uses of the Co—Fe and Co—Fe—Hf films as additional sense layers lead to an $R_J A_J$ of as low as 1.5 Ω-μm² and a $\Delta R_T/R_J$ of as high as 90.3%. The insertion of the Co—Fe reference layer between the Co—Fe—B reference and $MgO_X$ barrier layers does not cause a further decrease in $R_J A_J$, but causes a further $\Delta R_T/R_J$ increase.

In other words, it is found from FIGS. 9 and 10 that after separating the $MgO_X$ barrier layer from the Co—Fe—B reference layer by the Co—Fe reference layer and from the Co—Fe—B sense layer by the Co—Fe sense layer, $R_J A_J$ decreases from 2.0 to 1.6 Ω-μm² and $\Delta R_T/R_J$ increases from 28.8 to 72.5%. The $R_J A_J$ decrease may originate from a decrease in contact resistance at lower and upper interfaces of the $MgO_X$ barrier layer, where no B segregates exist. The $\Delta R_T/R_J$ increase, however, is unexpected, since it has been taught in the prior art that the Co—Fe—B(001)[110]//$MgO_X$(001)[100]//Co—Fe—B(001)[110] epitaxial relationship is essential for substantially enhancing the TMR effect. The Co—Fe sense and reference layers may thus play transparent roles in not only maintaining the epitaxial relationship but also further enhancing the TMR effect.

Figure 11:
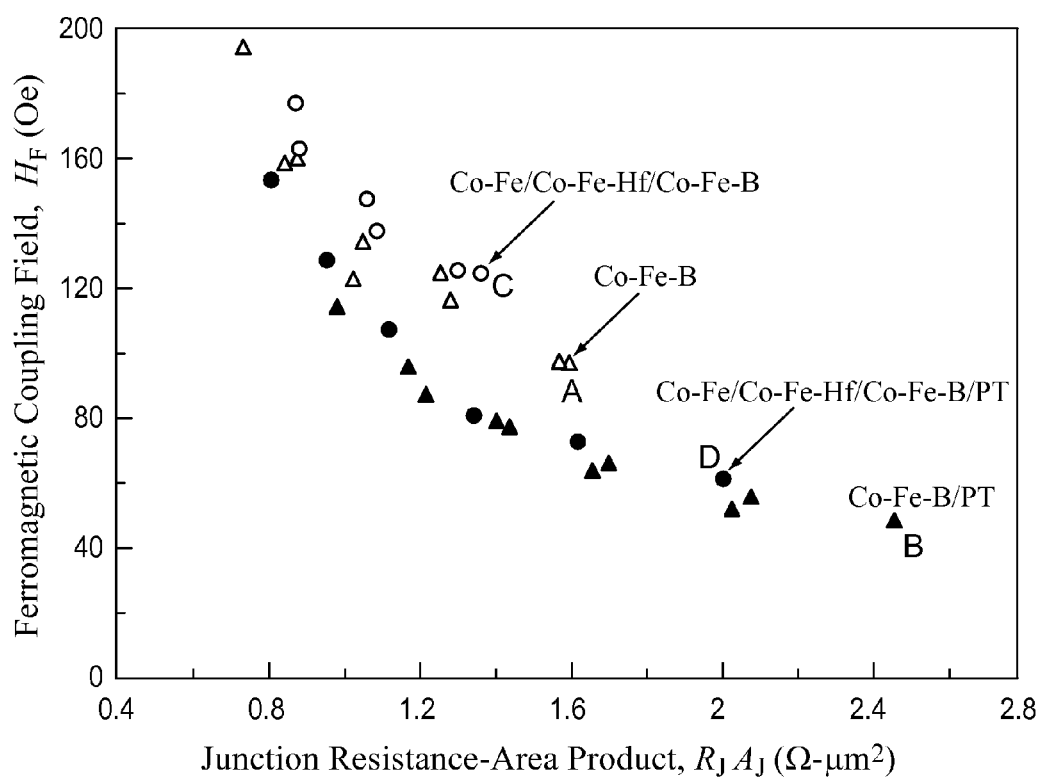
FIG. 11 is a chart showing $H_F$ versus $R_JA_J$ for TMR read sensors comprising Ta(3)/Ru(2)/Co—Fe(2.2)/Ru(0.8)/reference/MgO$_X$/Co—Fe(0.4)/Co—Fe—B(1.6)/Co—Fe—Hf (1.4)/Ru(6) layers, where the reference layers are formed by Co—Fe—B(2.4), Co—Fe—B(2.7)/plasma-treated, Co—Fe (0.4)/Co—Fe—Hf(1.2)/Co—Fe—B(1.6), and Co—Fe(0.4)/Co—Fe—Hf(1.2)/Co—Fe—B(1.9)/plasma-treated films.
Figure 12:
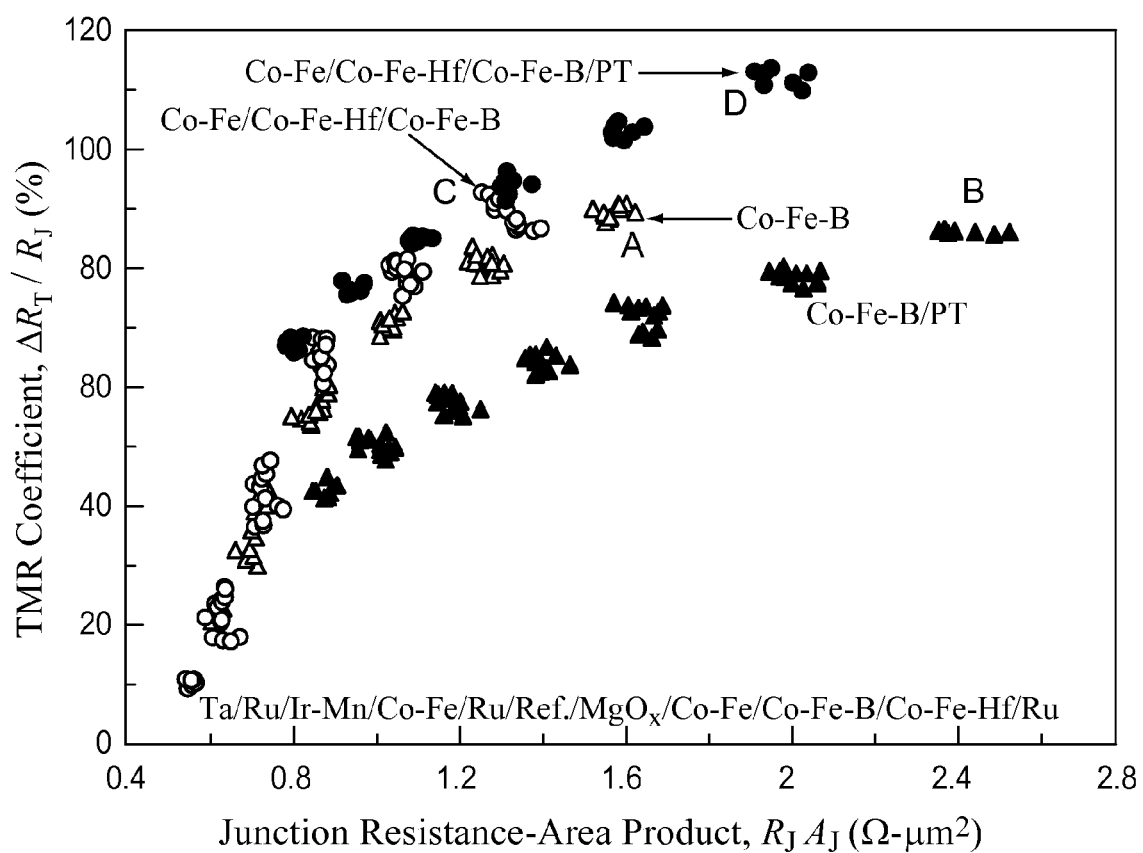
FIG. 12 is a chart showing $\Delta R_T/R_J$ versus $R_JA_J$ for TMR read sensors corresponding to those as shown in FIG. 11.

FIGS. 11 and 12 show $H_F$ and $\Delta R_T/R_J$, respectively, versus $R_J A_J$ for TMR read sensors comprising Ta(3)/Ru(2)/Co—Fe(2.2)/Ru(0.8)/reference/$MgO_X$/Co—Fe(0.4)/Co—Fe—B(1.6)/Co—Fe—Hf(1.4)/Ru(6) layers, where the reference layers are formed by Co—Fe—B(2.4), Co—Fe—B(2.7)/plasma-treated, Co—Fe(0.4)/Co—Fe—Hf(1.2)/Co—Fe—B(1.6), and Co—Fe(0.4)/Co—Fe—Hf(1.2)/Co—Fe—B(1.9)/plasma-treated films. The Co—Fe first and Co—Fe—Hf second reference layers are sandwiched between the Ru antiparallel-coupling and Co—Fe—B reference layers. The thickness of the Co—Fe—B reference layer is adjusted in order for the multiple reference layers to attain the designed magnetic moment of 0.30 memu/cm². The Co—Fe—B reference layer to be plasma-treated is thicker by 0.3 nm in order to attain the same designed magnetic moment after the plasma treatment.

After conducting the plasma treatment for the TMR read sensor with the Co—Fe—B reference layer and a 0.8 nm thick $MgO_X$ barrier layer (labeled as A and B in FIGS. 11 and 12), $R_JA_J$ increases from 1.6 to 2.5 $\Omega$-$\mu m^2$, $H_F$ decreases from 97.1 to 48.3 Oe, and $\Delta R_T/R_J$ decreases from 89.7 to 86.3%. After conducting the plasma treatment for the TMR read sensor with the Co—Fe/Co—Fe—Hf/Co—Fe—B reference layers and a 0.8 nm thick $MgO_X$ barrier layer (labeled as C and D in FIGS. 11 and 12), $R_JA_J$ increases from 1.4 to 2.0 $\Omega$-$\mu m^2$, $H_F$ decreases from 124.6 to 61.1 Oe, and $\Delta R_T/R_J$ increases from 87.2 to 112.2%. In both cases, the plasma treatment causes a substantial $H_F$ decrease due to the smoothness improvement on the surface of the Co—Fe—B reference layer, but also causes a substantial $R_JA_J$ increase due to inevitable argon gas bombardments on the surface. In addition, the plasma treatment applied to the Co—Fe—B reference layer is not viable in enhancing the TMR effect, but that applied to the Co—Fe/Co—Fe—Hf/Co—Fe—B reference layers becomes viable.

On the other hand, the uses of the Co—Fe and Co—Fe—Hf reference layers also cause an $R_JA_J$ decrease from 1.6 to 1.4 $\Omega$-$\mu m^2$ when the plasma treatment is not conducted, and that from 2.5 to 2.0 $\Omega$-$\mu m^2$ when the plasma treatment is conducted. The $R_JA_J$ decrease indicates that the Co—Fe and Co—Fe—Hf reference layers also act as diffusion barrier layers in suppressing B diffusion into the Ru antiparallel coupling layer.

Figure 13:
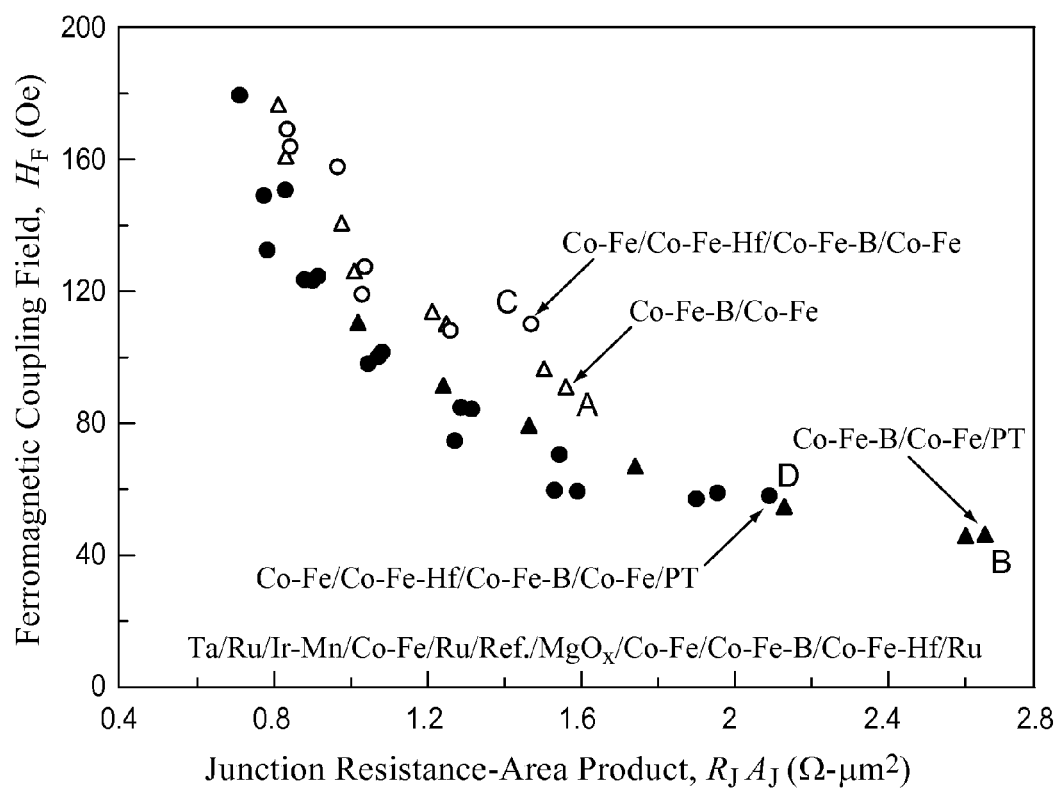
FIG. 13 is a chart showing $H_F$ versus $R_JA_J$ for TMR read sensors comprising Ta(3)/Ru(2)/Co—Fe(2.2)/Ru(0.8)/reference/MgO$_X$/Co—Fe(0.4)/Co—Fe—B(1.6)/Co—Fe—Hf (1.4)/Ru(6) layers, where the reference layers are formed by Co—Fe—B(2.0)/Co—Fe(0.3), Co—Fe—B(2.0)/Co—Fe (0.6)/plasma-treated, Co—Fe(0.4)/Co—Fe—Hf(1.2)/Co—Fe—B(1.2)/Co—Fe(0.3), and Co—Fe(0.4)/Co—Fe—Hf (1.2)/Co—Fe—B(1.2)/Co—Fe(0.6)/plasma-treated films.
Figure 14:
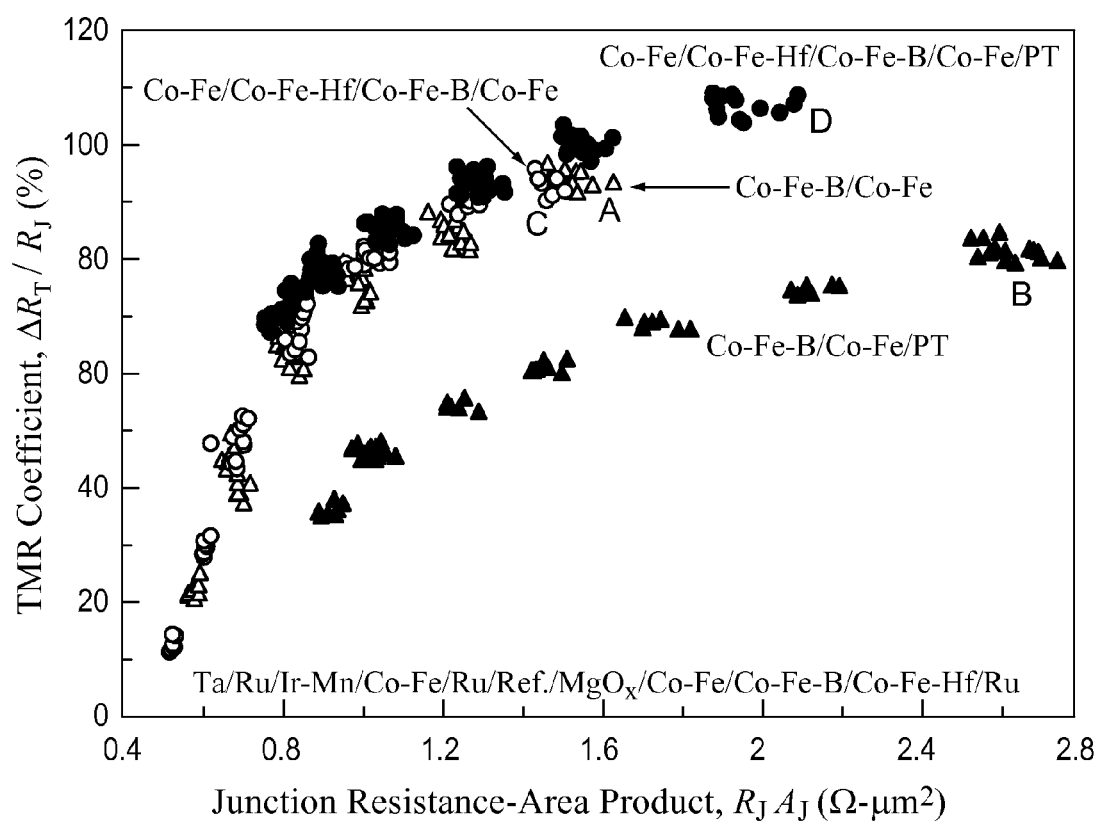
FIG. 14 is a chart showing $\Delta R_T/R_J$ versus $R_JA_J$ for TMR read sensors corresponding to those as shown in FIG. 13.

FIGS. 13 and 14 show $H_F$ and $\Delta R_T/R_J$, respectively, versus $R_JA_J$ for TMR read sensors comprising Ta(3)/Ru(2)/Co—Fe(2.2)/Ru(0.8)/reference/$MgO_X$/Co—Fe(0.4)/Co—Fe—B(1.6)/Co—Fe—Hf(1.4)/Ru(6) layers, where the reference layers are formed by Co—Fe—B(2.0)/Co—Fe(0.3), Co—Fe—B(2.0)/Co—Fe(0.6)/plasma-treated, Co—Fe(0.4)/Co—Fe—Hf(1.2)/Co—Fe—B(1.2)/Co—Fe(0.3), and Co—Fe(0.4)/Co—Fe—Hf(1.2)/Co—Fe—B(1.2)/Co—Fe(0.6)/plasma-treated films. The Co—Fe upper reference layer is sandwiched between the Co—Fe—B reference and $MgO_X$ barrier layers. The thickness of the Co—Fe—B reference layer is adjusted in order for the multiple reference layers to attain the designed magnetic moment of 0.30 memu/cm². The Co—Fe upper reference layer to be plasma-treated is thicker by 0.3 nm in order to attain the same designed magnetic moment after the plasma treatment.

After conducting the plasma treatment for the TMR read sensor with the Co—Fe—B/Co—Fe reference layers and a 0.8 nm thick $MgO_X$ barrier layer (labeled as A and B in FIGS. 13 and 14), $R_JA_J$ increases from 1.6 to 2.6 $\Omega$-$\mu m^2$, $H_F$ decreases from 91.5 to 46.2 Oe, and $\Delta R_T/R_J$ decreases from 92.6 to 82.1%. After conducting the plasma treatment for the TMR read sensor with the Co—Fe/Co—Fe—Hf/Co—Fe—B/Co—Fe reference layers and a 0.8 nm thick $MgO_X$ barrier layer (labeled as C and D in FIGS. 13 and 14), $R_JA_J$ increases from 1.5 to 2.1 $\Omega$-$\mu m^2$, $H_F$ decreases from 110.5 to 58.3 Oe, and $\Delta R_T/R_J$ increases from 93.0 to 108.0%. In both cases, the plasma treatment causes a substantial $H_F$ decrease due to the smoothness improvement on the surface of the Co—Fe reference layer, but also causes a substantial $R_JA_J$ increase due to inevitable argon gas bombardments on the surface. In addition, the plasma treatment applied to the Co—Fe—B/Co—Fe reference layers is not viable in enhancing the TMR effect, but that applied to the Co—Fe/Co—Fe—Hf/Co—Fe—B/Co—Fe reference layers becomes viable.

On the other hand, the uses of the Co—Fe and Co—Fe—Hf reference layers also cause an $R_JA_J$ decrease from 1.6 to 1.5 $\Omega$-$\mu m^2$ when the plasma treatment is not conducted, and that from 2.6 to 2.1 $\Omega$-$\mu m^2$ when the plasma treatment is conducted. The $R_JA_J$ decrease indicates that the Co—Fe and Co—Fe—Hf reference layers also act as diffusion barrier layers in suppressing B diffusion into the Ru antiparallel coupling layer.

The TMR read sensor fabricated for the hard disk drive according to the exemplary embodiment of the invention is also evaluated. In the fabrication process, the TMR read sensor is deposited on wafers with lower shields formed by 1 $\mu m$ thick ferromagnetic Ni—Fe films in a sputtering system, and is annealed in a magnetic field of 50,000 Oe for 5 hours at 240° C. in a high-vacuum oven. The TMR read sensor is then patterned into round devices of 750 nm in diameter, and are probed with a four-point probe in a magnetic field of 2,000 Oe to determine $H_F$, $R_JA_J$, and $\Delta R_T/R_J$.

Figure 15:
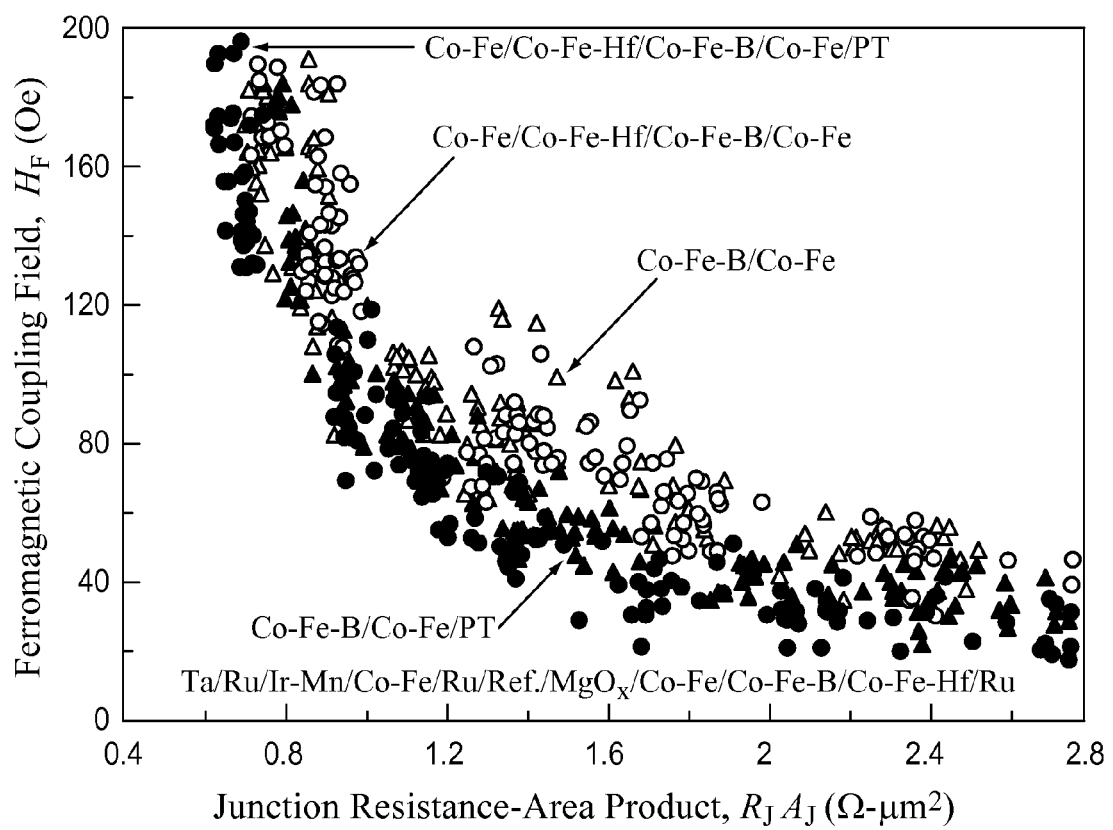
FIG. 15 is a chart showing $H_F$ versus $R_JA_J$ for patterned TMR read sensors comprising Ta(3)/Ru(2)/Co—Fe(2.2)/Ru (0.8)/reference/MgO$_X$/Co—Fe(0.4)/Co—Fe—B(1.6)/Co—Fe—Hf(1.4)/Ru(6) layers, where the reference layers are formed by Co—Fe—B(2.0)/Co—Fe(0.3), Co—Fe—B(2.0)/Co—Fe(0.6)/plasma-treated, Co—Fe(0.4)/Co—Fe(1.2)/Co—Fe—B(1.2)/Co—Fe(0.3), and Co—Fe(0.4)/Co—Fe (1.2)/Co—Fe—B(1.2)/Co—Fe(0.6)/plasma-treated films.
Figure 16:
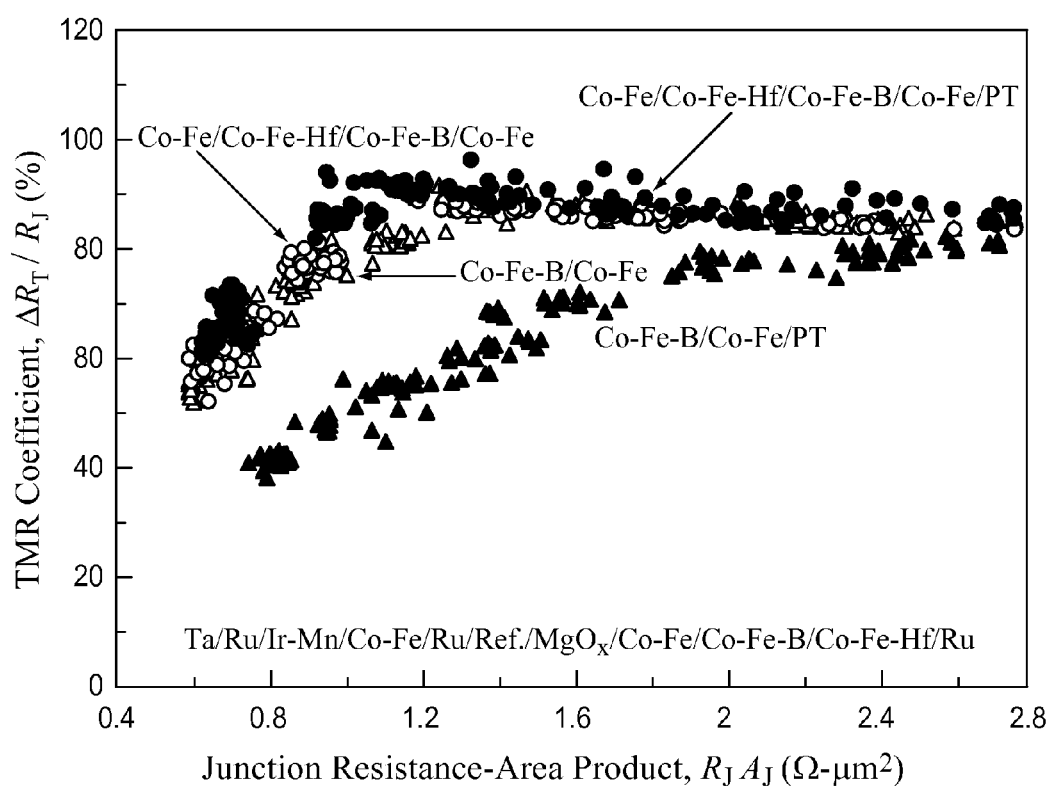
FIG. 16 is a chart showing $\Delta R_T/R_J$ versus $R_JA_J$ for patterned TMR read sensors corresponding to those as shown in FIG. 15.

FIGS. 15 and 16 show $H_F$ and $\Delta R_T/R_J$, respectively, versus $R_JA_J$ for patterned TMR read sensors comprising Ta(3)/Ru(2)/Co—Fe(2.2)/Ru(0.8)/reference/$MgO_X$/Co—Fe(0.4)/Co—Fe—B(1.6)/Co—Fe—Hf(1.4)/Ru(6) layers, where the reference layers are formed by Co—Fe—B(2.0)/Co—Fe(0.3), Co—Fe—B(2.0)/Co—Fe(0.6)/plasma-treated, Co—Fe(0.4)/Co—Fe(1.2)/Co—Fe—B(1.2)/Co—Fe(0.3), and Co—Fe(0.4)/Co—Fe(1.2)/Co—Fe—B(1.2)/Co—Fe(0.6)/plasma-treated films. It is difficult to distinguish device results of the TMR read sensors with slightly different $MgO_X$ barrier layer thicknesses due to data scattering caused by difficulties in controlling sensor geometries and in protecting TMR properties during processing. However, the device results as shown in FIGS. 15 and 16 basically confirm the correctness of the modeled results as shown FIGS. 13 and 14, and clearly reveal advantages of the plasma treatment applied to the Co—Fe upper reference layer over an $R_JA_J$ range of from 0.6 to 2.8 $\Omega$-$\mu m^2$. For example, at the designed $R_JA_J$ of 1.2 $\Omega$-$\mu m^2$, the plasma treatment for the TMR read sensor with the Co—Fe/Co—Fe—Hf/Co—Fe—B/Co—Fe reference layers causes an $H_F$ decrease from about 100 to about 70 Oe, while maintaining $\Delta R_T/R_J$ of about 90%.

In the embodiments, TMR properties of the TMR read sensor are improved in at least six ways. First, polycrystalline Co—Fe lower and "hard" amorphous Co—Fe—Hf reference layers are used beneath the "soft" amorphous Co—Fe—B reference layer to suppress B diffusion. Second, a polycrystalline Co—Fe upper reference layer is used above the "soft" amorphous Co—Fe—B reference layer to also suppress B diffusion. Third, the "soft" amorphous Co—Fe—B reference layer is not only sealed, but also its thickness is substantially decreased without deteriorating the TMR effect. Fourth, in contrast to the $MgO_X$ barrier layer being sandwiched between the "soft" amorphous Co—Fe—B reference and sense layers in the prior art, it is sandwiched between the polycrystalline Co—Fe reference and sense layers. Fifth, the plasma treatment is only applied to the polycrystalline Co—Fe upper reference layer which also acts as a sacrificial layer in protecting spin polarization at the surface of the "soft" amorphous Co—Fe—B reference layer. Sixth, no replenishment with an additional Co—Fe or Co—Fe—B film is needed after the plasma treatment since the polycrystalline Co—Fe upper reference layer has protected the "soft" amorphous Co—Fe—B reference layer from spin polarization deterioration at its surface.

In the embodiments, the plasma treatment conducted for the TMR read sensor with the Co—Fe/Co—Fe—Hf/Co—Fe—B reference layers is so mild that spin polarization is not evidently deteriorated. In other embodiments not described here, when the plasma treatment is so severe to remove a 0.6 nm thick Co—Fe—B third reference layer, the replenishment with an additional Co—Fe—B film is needed to restore the spin polarization and recover the TMR effect. This replenishment inevitably creates a "stitched" interface in the replenished Co—Fe—B third reference layer, thus creating contact resistance and substantially increasing $R_JA_J$. On the other hand, when the plasma treatment conducted for the TMR read sensor with the Co—Fe/Co—Fe—Hf/Co—Fe—B/Co—Fe reference layers is so severe to remove a 0.6 or 0.9 nm thick Co—Fe fourth reference layer, as long as the Co—Fe fourth reference layer is so thick that its residue can still protect the Co—Fe—B third reference layer after the plasma treatment, the strong spin polarization and the high TMR effect still remain without the replenishment.

Although specific embodiments were described herein, the scope of the invention is not limited to those specific embodiments. The scope of the invention is defined by the following claims and any equivalents thereof.

I claim:

1. A reference layer structure of a current-perpendicular-to-plane (CPP) read sensor, the reference layer structure comprising:
    a first reference layer formed by a ferromagnetic polycrystalline film;
    a second reference layer formed by a first ferromagnetic amorphous film on the first reference layer;
    a third reference layer formed by a second ferromagnetic amorphous film on the second reference layer, wherein a composition of the first ferromagnetic amorphous film is distinct from a composition of the second ferromagnetic amorphous film; and
    a fourth reference layer formed by a ferromagnetic polycrystalline film on the third reference layer.

2. The reference layer structure of claim 1 wherein the first reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

3. The reference layer structure of claim 1 wherein the second reference layer is formed by a ferromagnetic amorphous Co—Fe—X film including Co with a content ranging from 60 to 80 at %, Fe with a content ranging from 0 to 40 at %, X with a content ranging from 6 to 30 at %, where X is Hf, Zr or Y, and having a thickness ranging from 0.6 to 3 nanometers.

4. The reference layer structure of claim 1 wherein the third reference layer is formed by a ferromagnetic amorphous Co—Fe—B film including Co with a content ranging from 60 to 80 at %, Fe with a content ranging from 0 to 40 at %, B with a content ranging from 6 to 30 at %, and having a thickness ranging from 1 to 2 nanometers.

5. The reference layer structure of claim 1 wherein the fourth reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

6. A current-perpendicular-to-plane (CPP) read sensor, comprising:
    a keeper layer;
    an antiparallel coupling layer on the keeper layer;
    multiple reference layers on the antiparallel coupling layer, the multiple reference layers comprising:
        a first reference layer formed by a ferromagnetic polycrystalline film;
        a second reference layer formed by a first ferromagnetic amorphous film on the first reference layer;
        a third reference layer formed by a second ferromagnetic amorphous film on the second reference layer, wherein a composition of the first ferromagnetic amorphous film is distinct from a composition of the second ferromagnetic amorphous film; and
        a fourth reference layer formed by a ferromagnetic polycrystalline film on the third reference layer;
    a barrier or spacer layer on the fourth reference layer; and
    sense layers on the barrier or spacer layer.

7. The CPP read sensor of claim 6 wherein the first reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

8. The CPP read sensor of claim 6 wherein the second reference layer is formed by a ferromagnetic amorphous Co—Fe—X film including Co with a content ranging from 60 to 80 at %, Fe with a content ranging from 0 to 40 at %, X with a content ranging from 6 to 30 at %, where X is Hf, Zr or Y, and having a thickness ranging from 0.6 to 3 nanometers.

9. The CPP read sensor of claim 6 wherein the third reference layer is formed by a ferromagnetic amorphous Co—Fe—B film including Co with a content ranging from 60 to 80 at %, Fe with a content ranging from 0 to 40 at %, B with a content ranging from 6 to 30 at %, and having a thickness ranging from 1 to 2 nanometers.

10. The CPP read sensor of claim 6 wherein the fourth reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

11. The CPP read sensor of claim 6 wherein the barrier layer is formed by an electrically insulating nonmagnetic $MgO_X$ film with a thickness ranging from 0.4 to 2 nanometers.

12. The CPP read sensor of claim 6 wherein the spacer layer is formed by an electrically conducting nonmagnetic Cu—O film with a thickness ranging from 1.6 to 4 nanometers.

13. The CPP read sensor of claim 6 wherein the multiple sense layers comprise:
    a first sense layer formed by a ferromagnetic polycrystalline film on the barrier or spacer layer;
    a second sense layer formed by the first ferromagnetic amorphous film on the first sense layer; and
    a third sense layer formed by the second ferromagnetic amorphous film on the second sense layer.

14. The CPP read sensor of claim 13 wherein the first sense layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

15. The CPP read sensor of claim 13 wherein the second sense layer is formed by a ferromagnetic amorphous Co—Fe—B film including Co with a content ranging from 60 to 80 at %, Fe with a content ranging from 0 to 40 at %, B with a content ranging from 6 to 30 at %, and having a thickness ranging from 1 to 2 nanometers.

16. The CPP read sensor of claim 13 wherein the third sense layer is formed by a ferromagnetic amorphous Co—Fe—X film including Co with a content ranging from 60 to 80 at %, Fe with a content ranging from 0 to 40 at %, X with a content ranging from 6 to 30 at %, where X is Hf, Zr or Y, and having a thickness ranging from 0.6 to 3 nanometers.

17. A hard disk drive, comprising:
    a hard disk; and
    a read head that includes a current-perpendicular-to-plane (CPP) read sensor for reading data from the hard disk, the CPP read sensor comprising:
        multiple seed layers;
        a pinning layer on the multiple seed layers;
        a flux closure structure on the pinning layer, wherein the flux closure structure comprises:

a keeper layer;

an antiparallel coupling layer on the keeper layer;

multiple reference layers on the antiparallel coupling layer, the multiple reference layers comprising:

a first reference layer formed by a ferromagnetic polycrystalline film;

a second reference layer formed by a first ferromagnetic amorphous film on the first reference layer;

a third reference layer formed by a second ferromagnetic amorphous film on the second reference layer, wherein a composition of the first ferromagnetic amorphous film is distinct from a composition of the second ferromagnetic amorphous film; and a fourth reference layer formed by a ferromagnetic polycrystalline film on the third reference layer;

a barrier or spacer layer on the flux closure structure;

multiple sense layers on the barrier or spacer layer; and a cap layer on the multiple sense layers.

18. The hard disk drive of claim 17 wherein the first reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

19. The hard disk drive of claim 17 wherein the second reference layer is formed by a ferromagnetic amorphous Co—Fe—X film including Co with a content ranging from 60 to 80 at %, Fe with a content ranging from 0 to 40 at %, X with a content ranging from 6 to 30 at %, where X is Hf, Zr or Y, and having a thickness ranging from 0.6 to 3 nanometers.

20. The hard disk drive of claim 17 wherein the third reference layer is formed by a ferromagnetic amorphous Co—Fe—B film including Co with a content ranging from 60 to 80 at %, Fe with a content ranging from 0 to 40 at %, B with a content ranging from 6 to 30 at %, and having a thickness ranging from 1 to 2 nanometers.

21. The hard disk drive of claim 17 wherein the fourth reference layer is formed by a ferromagnetic polycrystalline Co—Fe film including Co with a content ranging from 50 to 90 at %, Fe with a content ranging from 10 to 50 at %, and having a thickness ranging from 0.2 to 1.2 nanometers.

* * * * *